United States Patent
Yang et al.

(10) Patent No.: US 10,573,395 B1
(45) Date of Patent: Feb. 25, 2020

(54) SOURCE VOLTAGE MODULATED READS IN NON-VOLATILE MEMORIES

(71) Applicant: SanDisk Technologies LLC, Addison, TX (US)

(72) Inventors: Xiang Yang, Santa Clara, CA (US); Gerrit Jan Hemink, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/206,718

(22) Filed: Nov. 30, 2018

(51) Int. Cl.
*G11C 16/28* (2006.01)
*G11C 16/04* (2006.01)
*G11C 16/08* (2006.01)
*G11C 11/56* (2006.01)
*G11C 16/34* (2006.01)
*H01L 27/1157* (2017.01)

(52) U.S. Cl.
CPC .......... *G11C 16/28* (2013.01); *G11C 11/5671* (2013.01); *G11C 16/0483* (2013.01); *G11C 16/08* (2013.01); *G11C 16/3427* (2013.01); *G11C 16/0458* (2013.01); *H01L 27/1157* (2013.01)

(58) Field of Classification Search
None
See application file for complete search history.

(56) References Cited

U.S. PATENT DOCUMENTS

| 7,443,729 B2 * | 10/2008 | Li | G11C 11/5628 365/183 |
| 7,616,505 B2 | 11/2009 | Mui et al. | |
| 9,336,891 B2 | 5/2016 | Yuan et al. | |
| 9,349,478 B2 * | 5/2016 | Yuan | G11C 16/3427 |
| 9,552,251 B2 | 1/2017 | Yuan et al. | |
| 9,721,652 B2 | 8/2017 | Puthenthermadam et al. | |
| 2008/0158949 A1 * | 7/2008 | Mui | G11C 7/1006 365/185.03 |
| 2013/0322170 A1 * | 12/2013 | Goldman | G11C 16/28 365/185.03 |

* cited by examiner

*Primary Examiner* — Tan T. Nguyen
(74) *Attorney, Agent, or Firm* — Volpe and Koenig, P.C.

(57) ABSTRACT

Non-volatile memory strings, which are coupled to respective bit lines and source lines, may include multiple non-volatile memory cells coupled to respective word lines. Multiple sensing operations may be used to determine data programmed into a particular non-volatile memory cell. For example, a control circuit may sense multiple values from a particular non-volatile memory cell included in a non-volatile memory string using different voltage levels on a source line coupled to the non-volatile memory string. The control circuit may select one of the multiple values based on a program state of a different non-volatile memory cell adjacent to the particular non-volatile memory cell.

20 Claims, 12 Drawing Sheets

SOURCE VOLTAGE MODULATED READS IN NON-VOLATILE MEMORIES

BACKGROUND

Technical Field

This disclosure relates generally to memory circuits, and more particularly, to sensing data values stored in devices in non-volatile memories.

Description of the Relevant Art

Computer systems include processors and multiple memory circuits that store software programs or applications, as well as data being operated on by the processors. Such memories may vary in storage capacity as well as access time. In some computing systems, memories may be arranged in a hierarchical fashion, with smaller, faster memory circuits coupled directly to the processors, and larger, slower memory circuits coupled to the processors via a memory controller communicating with the processors via a communication link.

The memory circuits included in computer systems may be volatile or non-volatile. Volatile memory circuits require application of power in order to maintain previously stored data. Once power is removed from a volatile memory, previously stored data is lost. Non-volatile memory circuits, however, have the ability to maintain previously stored data in the absence of power.

In many cases, volatile memory circuits are higher performing (e.g., have faster access times) than non-volatile memory circuits. Volatile memory also typically permits a greater amount of repeated data storage operations than non-volatile memory circuits. As such, volatile memory circuits are often better suited to main or cache memory applications within a computer system, while non-volatile memory circuits are generally employed for secondary or long-term storage due to their lower performance resulting from challenges in sensing data stored in non-volatile memory cells.

Non-volatile memory circuits may use one of various non-volatile storage cells, such as flash cells, phase-change cells, ferroelectric cells, magnetoresistive cells, and the like. Such cells are programmed using a variety of techniques to adjust electrical or physical properties to encoded one or more data bits. The non-volatile data storage cells may be arranged in various cell array topologies. For example, the non-volatile storage cells may be arranged in a planar NAND string architecture, a three-dimensional NAND string architecture, a cross point architecture, or any other suitable architecture.

SUMMARY

Various embodiments of a non-volatile memory circuit are disclosed. Broadly speaking, an apparatus and a method are contemplated in which an array of non-volatile memory strings including a non-volatile memory string that includes a first data storage device coupled to a first word line and a second data storage device coupled to a second word line adjacent to the first word line. The non-volatile memory string is coupled to a source line. A control circuit may be configured to sense multiple values from the first data storage device using different voltage levels on the source line and select a particular one of the multiple values as the output of the first data storage device based on a program state of the second data storage device. In one embodiment, the control circuit may be further configured to, prior to sensing the multiple values from the first data storage device, set the first and second word lines to respective initial voltage levels and determine the program state of the second storage device using the respective initial voltage levels of the first and second word lines.

Figure 1:
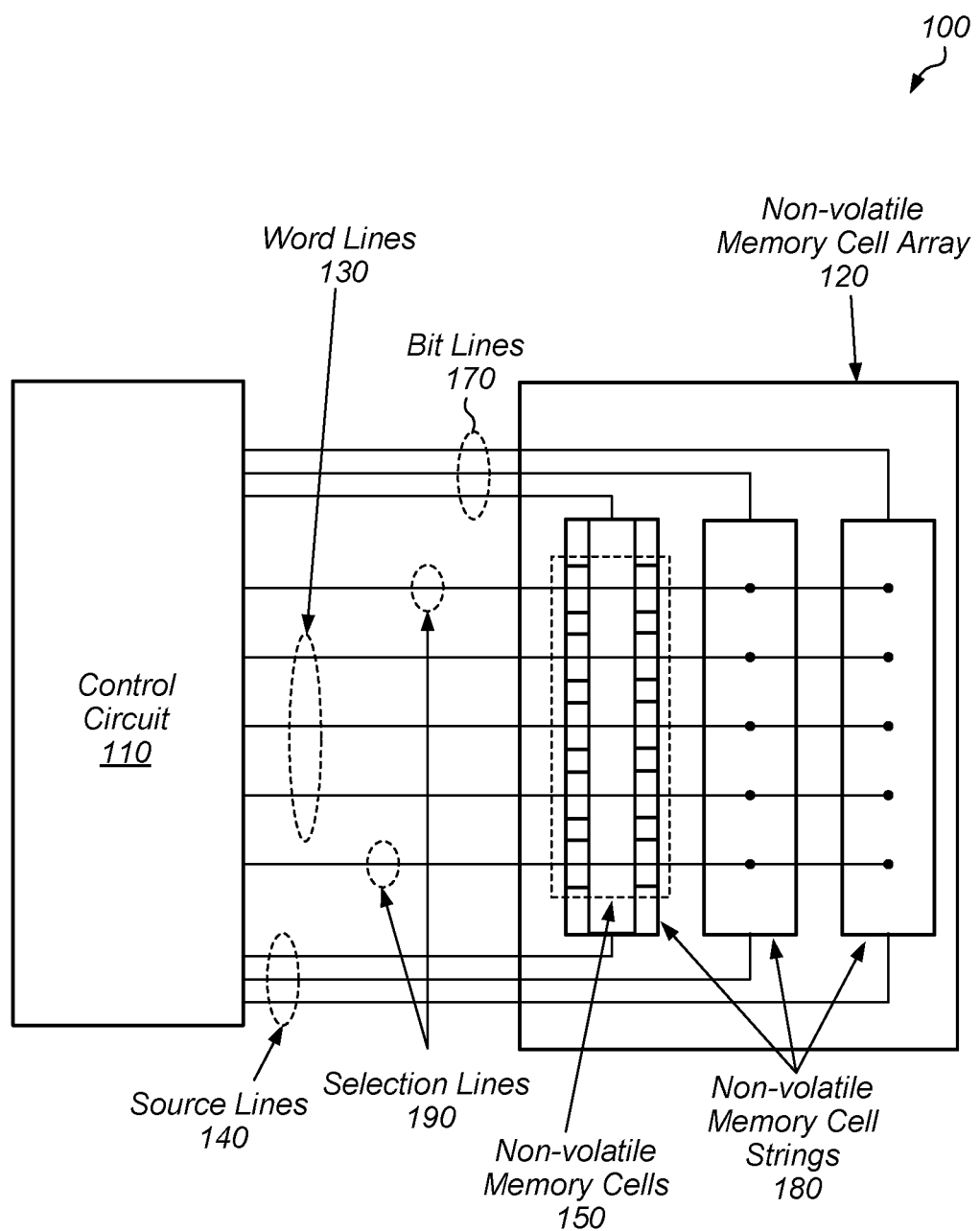
FIG. 1 is a generalized block diagram depicting an embodiment of a memory circuit.

While the disclosure is susceptible to various modifications and alternative forms, specific embodiments thereof are shown by way of example in the drawings and will herein be described in detail. It should be understood, however, that the drawings and accompanying detailed description are not intended to limit the disclosure to the particular form illustrated, but on the contrary, the intention is to cover all modifications, equivalents and alternatives falling within the spirit and scope of the present disclosure, including those defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to."

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Some NAND flash memory architectures employ three-dimensional strings of serially connected non-volatile memory cells (commonly referred to as "NAND strings") that are coupled to respective bit lines and source lines. The non-volatile memory cells included within a particular NAND string are coupled to respective word lines. Some non-volatile memory cells are capable of trapping charge in an insulating layer, which sets a threshold voltage of the non-volatile memory cell. Different threshold voltages may be used to represent different values of one or more data bits.

In some cases, the physical space between non-volatile memory cells within a NAND string are sufficiently small that operations performed on one non-volatile memory cell can affect the electrical characteristics of other non-volatile memory cells. For example, when a particular non-volatile memory cell transitions to a programmed voltage level, additional charge is trapped in that particular non-volatile memory cell, thereby changing the apparent threshold voltages of neighboring non-volatile memory cells (including non-volatile memory cells adjacent to the particular non-volatile memory cells) due to charge coupling effects. Additionally, trapped charge in particular non-volatile memory cell can migrate to neighboring non-volatile memory cells in a process commonly referred to as "lateral charge loss" or "LCL." Such migration of negative or positive charge can also affect the programmed threshold voltages of the neighboring non-volatile memory cells, resulting in difficulty in determining values of data bits stored in affected non-volatile memory cells.

One technique to remediate the effects of changes in the amount of trapped charge or the effect of parasitic charge coupling effects in a non-volatile memory cell due to the effects of adjacent non-volatile memory cells and their associated word lines is a look-ahead read (also referred to as a "data look-ahead read" or "DLA read"). In a look-ahead read, prior to reading a current word line (e.g. page) in a non-volatile memory, an adjacent word line in the non-volatile memory is read or sensed (commonly referred to as a "initial read operation"). If the data value stored/sensed on the adjacent word line for a memory cell on the same memory string is a value known to increase lateral charge loss with the current word line, then current word line is read in a way to compensate for the increased likelihood of lateral charge loss. By using the results obtained from reading the next word line of the non-volatile memory, adjustments can be made in reading the current word line to compensate for lateral charge loss. Additional information regarding look-ahead read operations may be found in U.S. Pat. No. 9,336,891 titled "Look Ahead Read Method for Non-Volatile Memory" filed on Jul. 2, 2014; this patent is hereby incorporated by reference in its entirety as though fully and completely set forth herein.

When reading/sensing the next word line as part of a DLA read operation, a full read/sense operation of memory cells of the next word line is not necessary. Instead, a rough determination of the threshold voltage (Vt) level is all that is needed to determine whether there has been a lateral charge loss for memory cells of the current word line. So, in one embodiment, the reading/sensing of the memory cells of the next word line uses a threshold voltage level that is in the middle of the range of possible programmed threshold voltages to sense the non-volatile memory cells of the next word line. Based on results of sensing the non-volatile memory cells in the next word line, the program state (e.g. one of the high Vt states or one of the low Vt states) of the cells may be determined. As used and described herein a "program state" of a non-volatile memory cell refers to whether or not a threshold voltage of the non-volatile cell has been set to a high or low value, a non-erased value.

Once the program states of the non-volatile memory cells in the next word line have been determined, the current word line is then read/sensed multiple times, each time under different conditions that shift the threshold voltages of the non-volatile memory cells in the current word line. In certain embodiments, the current word line may be read/sensed concurrently for two different threshold voltage levels. The shifts may, in some cases, correspond to an amount of shift in a threshold voltage of a non-volatile memory cell resulting from lateral charge loss or other mechanisms that can change the amount of trapped charge and, therefore, the threshold voltage of a non-volatile memory cell. Using the program state of non-volatile memory cells in the next word line that are adjacent to non-volatile memory cells in the current word line, a final output value of a particular non-volatile memory cell may be determined.

While a DLA read can result in more accurate sensing, this technique may in turn cause certain problems. For example, the time required to determine the program state of an adjacent non-volatile memory cell adds to the access time for the memory circuit. Such an increase in access time of the memory circuit can result in slower overall operation of a computer system that includes the memory circuit. Moreover, shifting the threshold voltage of the non-volatile memory cell can be inefficient. For example, generating a shift in the threshold voltage of the non-volatile memory cell being sensed may be accomplished by changing the voltage levels of word lines coupled to adjacent non-volatile memory cells. The amount of shift in the threshold voltage that can be realized using this technique is limited, thereby limiting the efficiency of data look-ahead techniques.

The disclosed embodiments are designed to remediate the effects of changes in the amount of trapped charge in a non-volatile memory cell, while at the same time reducing the time associated with performing a data look-ahead operation and increasing the efficiency of shifting the threshold voltage of the non-volatile memory cell. One such non-volatile memory circuit that may, in certain instances, address some or all of the above-noted problems is illustrated in FIG. 1. As illustrated, non-volatile memory circuit 100 includes non-volatile memory cell array 120 and control circuit 110.

Non-volatile memory cell array 120 includes non-volatile memory cell strings 180. As illustrated, one of non-volatile memory cell strings 180 is coupled to one of bit line 170 and one of source lines 140, and includes non-volatile memory cells 150, which are coupled to respective ones of word lines 130. For purposes of this disclosure, two non-volatile memory cells are considered to be "adjacent" to each other when there is no other non-volatile memory cell between them within a particular non-volatile memory cell string. Thus, where a first non-volatile memory cell has a drain that is directly coupled (i.e., without an intervening gate region of another data storage device) to a source of a second non-volatile memory cell, the first and second non-volatile memory cells are adjacent to one another. This concept of "adjacency" of non-volatile memory cells can also be extended to word lines. Thus, two word lines that are coupled to adjacent non-volatile memory cells can be said to be adjacent word lines. Although the effects relating to lateral charge loss are described in the context of adjacent non-volatile memory cells and word lines, in some cases, similar charge loss effects on a particular non-volatile memory cell may be induced by non-volatile memory cells and word lines that are not adjacent to the particular non-volatile memory cell. Such non-volatile memory cells and word lines can thus be said to be "neighboring" non-volatile memory cells and word lines relative to the particular non-volatile memory cells. The concept of "neighboring" non-volatile memory cells to the particular non-volatile memory cell includes adjacent non-volatile memory cells, as well as non-adjacent non-volatile memory cells that nonetheless induce charge loss effects in the particular non-volatile memory cells.

Some non-volatile memory cells rely on trapped charge to store a given data value. The trapped charge may determine or alter a threshold voltage of a device included in a non-volatile memory cell, which corresponds to a value of one or more data bits. Within a NAND string, various effects, such as lateral charge loss, can cause a change in the trapped charge of a non-volatile memory cell. As described below in more detail, when an amount of trapped charge is modified within a non-volatile memory cell, normal sensing operations may lead to incorrect identification of the corresponding value of the one or more data bits.

To compensate for the effects of changes in the amount of trapped charge in a non-volatile memory cell, embodiments of control circuit 110 disclosed herein are configured to sense multiple values from the first non-volatile memory cell using different voltage levels on the source line and select a particular one of the multiple values as the output of the first non-volatile memory cell based on a program state of the second non-volatile memory cell. Shifts in the threshold voltage of the first non-volatile memory cell result from the changes in the voltage level of the source line. Such shifts reduce disturbances on the first non-volatile memory cell from the first word line, thereby improving efficiency and accuracy of the sensing operation. In some cases, control circuit 110 may be further configured to sense a first value using a first voltage level on the source line and sense a second value using a second voltage of the source line.

By selecting one of the multiple data values based on the previously determined program state, adjustments may be made for changes in the threshold voltage of the non-volatile memory cell resulting from changes in the amount of trapped charge in the non-volatile memory cell. For example, if the program state of a cell is indicative of a high threshold voltage programmed in the second storage device, negative charge may have migrated to the first data storage device, increasing the programmed threshold of the first data storage device. Alternatively, if the program state of a cell is indicative of a high threshold voltage programmed in the second storage device, positive charge may have migrated from the first data storage device to the second data storage device, increasing the programmed threshold of the first data storage device as well. To compensate for the increase in the threshold voltage of the first data storage device one of the multiple values corresponding to a decreased threshold voltage of the first data storage device may be selected as the output value. In a similar fashion, if the program state is indicative of a low threshold voltage programmed in the second data storage device, negative charge from the first device may migrate to the second device, decreasing the threshold voltage of the first device. Alternatively, if the program state is indicative of a low threshold voltage programmed in the second data storage device, positive charge from the second device may migrate to the first device, decreasing the threshold voltage of the first device. Accordingly, one of the multiple values corresponding to an increased threshold voltage of the first data storage device may be selected as the output value.

In some embodiments, control circuit 110 is further configured to, prior to sensing the multiple values from the first non-volatile memory cell, set the first and second word lines to respective initial voltage levels and determine the program state of the second non-volatile memory cell using the respective initial voltage levels of the first and second word lines. In order to determine the program state of the second non-volatile memory cell, the second word line is set to a voltage level that is suitable to determine if the threshold voltage of the second non-volatile memory cell is programmed to a high or low value. In some cases, the voltage level of the second word line may be less than the voltage level of the first word line. While the determination is in progress, the first non-volatile memory cell must be conducting, so the voltage level of the first word line is set to a voltage level sufficient to put the first non-volatile memory cell in a conducting mode. Accordingly, the initial voltage level of the first word line may, in some cases, be greater than the initial voltage level of the second word line. In some cases, a voltage level of a bit line coupled to non-volatile memory string including the first and second storage device may be compared to a particular reference voltage to determine if the second non-volatile memory cell has been programmed with a high or low threshold value.

Control circuit 110 may be further configured to, after determining the program state of the second non-volatile memory cell and prior to sensing the multiple values from the first non-volatile memory cell, modify, without an intervening pre-charge cycle, the respective initial voltage levels of the first and second word lines to generate respective modified voltage levels on the first and second word lines. Once the program state of the second non-volatile memory cell has been determined, the voltage level of the second word line is increased to place the second non-volatile memory cell in a conductive mode so that the first non-volatile memory cell can be sensed. Accordingly, the modified voltage of the second word line may be greater than the initial voltage level of the second word line. By directly transitioning the second word line from its initial voltage level to its modified voltage level, any delay before the start of the multiple sensing operations associated with a pre-charge operation may be eliminated.

As described above, non-volatile memory strings include multiple serially connected devices (also referred to herein as transistors), each of which can be programmed to store one or more data bits. Such non-volatile memory strings may be constructed in various ways. In some cases, the serially connected devices are fabricated on the surface of a silicon substrate in a planar fashion. Alternatively, the serially connected devices may be fabricated in a stack extending vertically from the surface of the silicon substrate. Non-volatile memory strings fabricated as stacks extending from the substrate are commonly referred to as "3D NAND strings."

Figure 2:
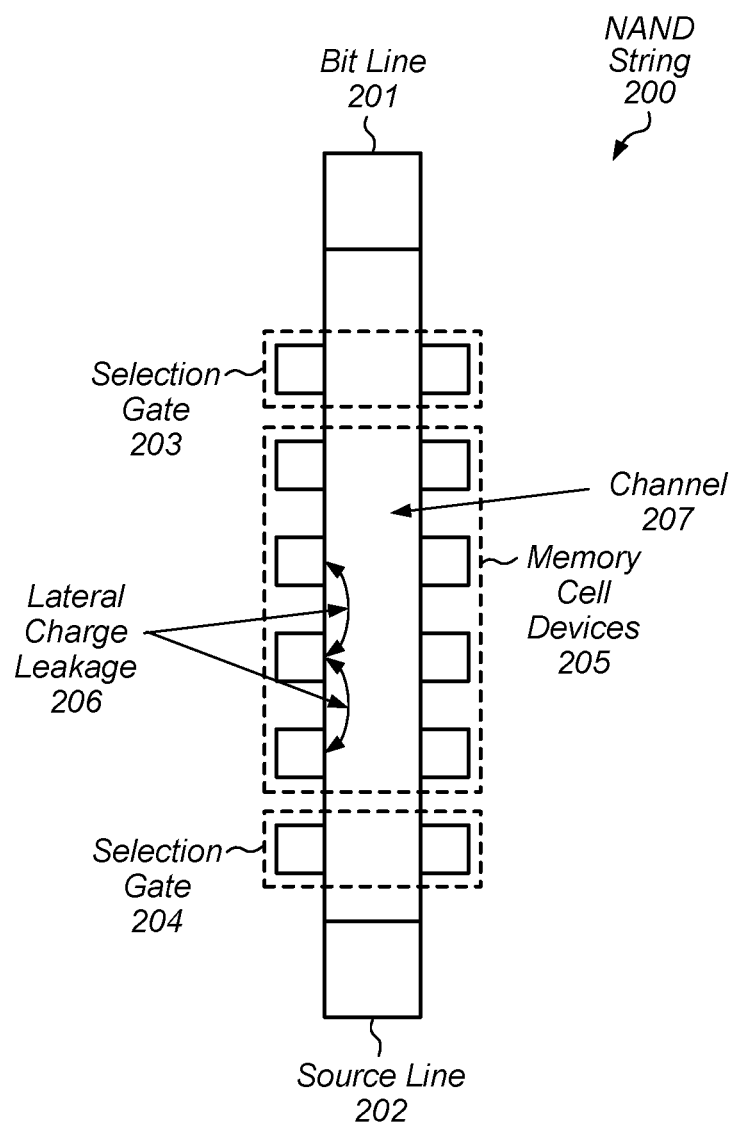
FIG. 2 is a block diagram illustrating an embodiment of a NAND string.

A cross-section of a 3D NAND string is illustrated in FIG. 2. As illustrated, NAND string 200 includes memory cell devices 205, selection gate 203, and selection gate 204. Selection gate 203 is coupled to bit line 201 and selection gate 204 is coupled to source line 202. Each of memory cell device 205, selection gates 203 and 204 are coupled to channel 207, and may locally change resistivity of channel 207 based on respective threshold voltages of the devices and voltage levels applied to the devices respective control terminals. As described below, control terminals of memory cell devices 205, selection gate 203, and selection gate 204 may be coupled to respective word lines and selection lines that are used to activate and program the individual gates. Selection gate 203 and selection gate 204 are configured to selectively couple memory cell devices 205 to bit line 201 and source line 202, respectively. Each of memory cells devices 205 is configured to store one or more data bits as different threshold voltage values and may be particular embodiments of non-volatile memory cells. As used and described herein, a non-volatile memory cell is a memory cell that can maintain, in the absence of power being applied to the memory cell, a state corresponding to one or more stored data bits. For example, non-volatile memory cells may include, charge trap memory cells, floating gate memory cells, memristor memory cells, magnetoresistive memory cells, phase change memory cells, ferroelectric memory cells, and the like Memory cell devices 205, selection gate 203 and selection gate 204 are particular examples of non-volatile charge trap devices. As described below in more detail, a charge trap device includes an insulating layer that can trap electrons during a programming operation; a number of trapped electrons determine a threshold voltage for the device. As used herein, a threshold voltage refers to a voltage level applied to a control terminal of a charge trap device that enables conduction through the body of the charge trap device. When the voltage level applied to the control terminal of the charge trap device is less than the threshold voltage, conduction through the body of the charge trap device is prevented.

In some cases, the spacing between individual devices included in memory cell device 205 allows for charge trapped in one memory cell to migrate to adjacent memory cells in a process commonly referred to as "lateral charge loss" or "LCL." As illustrated, charge trapped in a particular non-volatile memory cell can migrate (lateral charge leakage 206) to other non-volatile memory cells located above or below the particular non-volatile memory cell in the 3D NAND string.

The lateral charge loss may be a result of interference from the word lines coupled to the adjacent non-volatile memory cells. As the voltage levels of the adjacent word lines are changed during operations such as reading, programming, and erasing, charge trapped in the particular non-volatile memory cells can be forced out of a charge trap material included in the particular non-volatile memory cell.

Lateral charge loss may also be a result of the potential difference in the amount of charge stored in two adjacent cells. For example, if a particular non-volatile memory cell is programmed with a low threshold voltage and an adjacent non-volatile memory cells is programmed with a high threshold voltage, charge from the adjacent non-volatile memory cell may migrate into the particular non-volatile memory cells, artificially increasing its threshold voltage.

Changes in the programmed threshold voltage of non-volatile memory cells can result in difficulties in determining the data originally programmed into the non-volatile memory cells. The disclosed techniques may advantageously allow for accurate sensing of cells that have undergone lateral charge loss while reducing impact on memory circuit performance and timing. Similarly, the disclosed techniques may be effective for accurate sensing of cells that have undergone apparent threshold voltage changes due to parasitic charge coupling effects caused by charges stored in adjacent memory cells.

Figure 3:
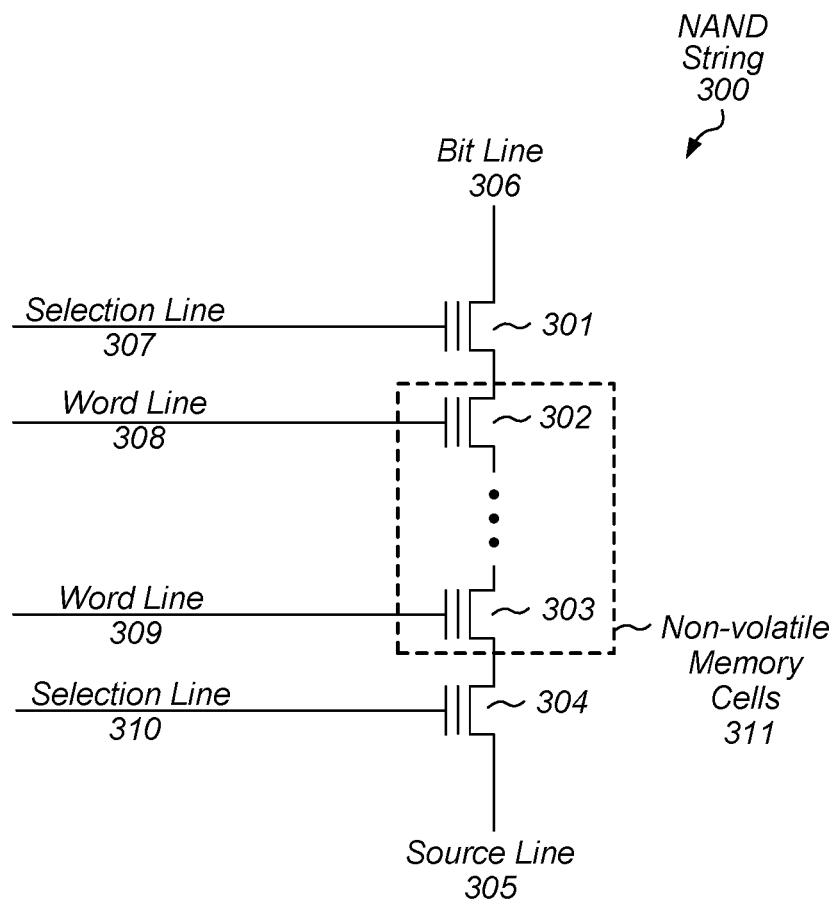
FIG. 3 illustrates a schematic diagram depicting an embodiment of a NAND string.

A schematic representation of a NAND string is illustrated in FIG. 3. As illustrated, NAND string 300 includes select gate drain device 301, non-volatile memory cells 311, and select gate source device 304. Non-volatile memory cells 311 includes devices 302 and 303. In various embodiments, each of devices 302-303 may be charge trap devices (e.g., floating gate metal-oxide semiconductor field-effect transistors) configured to trap charge in an insulating layer, where the trapped charge determines a threshold voltage level at which the transistor activates and is able to conduct current.

Select gate drain device 301 is coupled to bit line 306 and non-volatile memory cells 311, and is configured to selectively couple the string of transistors included in non-volatile memory cells 311 to bit line 306 based on the state of selection line 307. In various embodiments, selection line 307 may be included in selection lines 190 and may be based on a decoding of an address signal. By activating select gate drain device 301, current may flow from bit line 306 to source line 305 based on a programmed state of non-volatile memory cells 311, which allows a determination of the programmed state of non-volatile memory cells 311, thereby determining the stored data. It is noted that select gate source device 304 may be operated in a similar fashion to select gate drain device 301.

Each of devices 302 and 303 included in non-volatile memory cells 311 is configured to store one or more data bits based on a value of an electrical characteristic of the devices. For example, in some cases, a threshold voltage associated with one of non-volatile memory cells 311 may be set to a particular voltage level. The particular voltage level may correspond to a data bit value, or combination of data bit values.

Non-volatile memory cells 311 may be programmed in a similar fashion to the devices included in select gate drain device 301 and select gate source device 304, although the programmed threshold voltages may correspond to a particular data bit value or combination of data bits values. By applying a programming voltage to a particular one of word lines 308 and 309 while the channel between bit line 306 and source line 305 is held at or near ground potential, electrons can become trapped within an insulating layer included in the devices, thereby setting threshold voltages for the devices.

Various techniques may be employed to retrieve previously programmed data from non-volatile memory cells 311. One such technique involves pre-charging, to a particular voltage level, a bit line coupled to a memory cell to be read and then applying different voltage levels to a control terminal of the memory cell. As each voltage level is applied to the control terminal, the voltage level of the bit line is checked to see if the bit line has discharged through the memory cell. By determining which control terminal voltage results in a discharge of the bit line, the threshold voltage set in the memory cell and, therefore, the value of the data bit(s) stored in the memory cell can be determined.

To use the technique described above, selection lines 307 and 310 are set to voltage levels to enable select gate drain device 301 and select gate source device 304, respectively, thereby coupling the NAND string 300 to bit line 306. With select gate drain device 301 and select gate source device 304 activated, bit line 306 may be pre-charged to a particular voltage level and word lines 308 and 309 may be set to given voltage level sufficient to activate devices 302 and 303. A selected one of word lines 308 and 309 may be decreased in voltage, which may deactivate its corresponding one of non-volatile memory cells 311 depending on how its threshold voltage has been set. If the corresponding one of non-volatile memory cells 311 remains activated, then bit line 306 will discharge through the string of devices into source line 305. Detecting the amount of discharge of bit line 306 can be used to determine the data value programmed into the corresponding one of the memory cells.

The retrieval process for previously programmed data is presented as an example. In other non-volatile memory circuit architectures, different retrieval processes may be employed.

It is noted that the particular NAND string depicted in FIG. 3 is merely one possible example. For example, in other embodiments, different numbers of devices may be coupled to non-volatile memory cells 311 to bit line 306 and source line 305.

Figure 4:
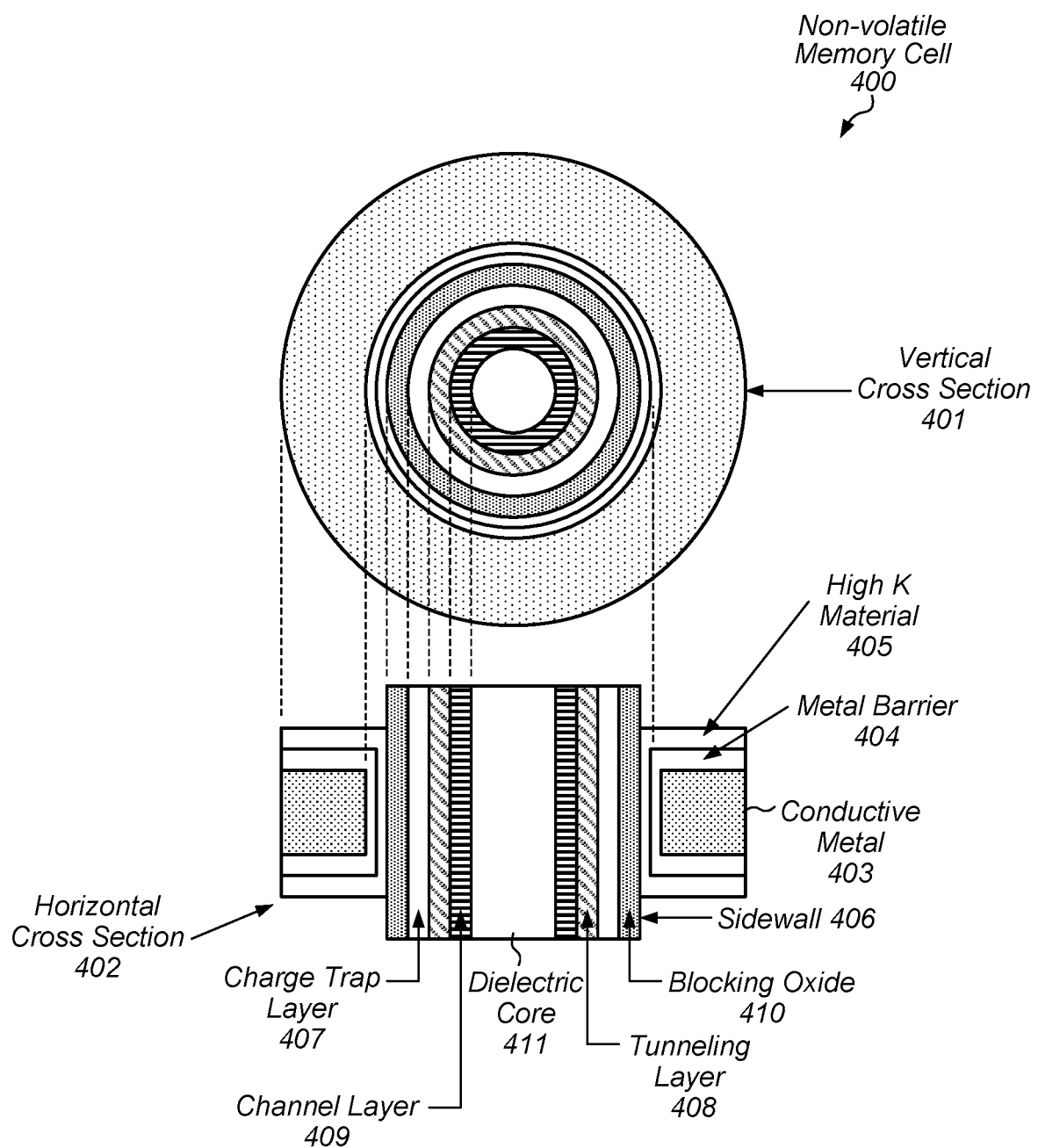
FIG. 4 illustrates a block diagram of a non-volatile memory cell.

Non-volatile memory cells are formed at different levels of a NAND string at the intersection of layers including word lines or other control lines with the NAND string. Vertical and horizontal cross-sections of such a non-volatile memory cell are illustrated in FIG. 4. In various embodiments, non-volatile memory cell 400 may correspond to any of devices 302 through 303 as depicted in FIG. 3. Non-volatile memory cell 400 includes various layers that may be deposited along sidewall 406 within a given word line layer using atomic layer deposition or any other suitable process. As illustrated in horizontal cross section 402, such layers include blocking oxide 410, charge trap layer 407, tunneling layer 408, channel layer 409, and dielectric core 411. In some embodiments, charge trap layer 407 may include silicon nitride (Si3N4) or other suitable nitride, and tunneling layer 408 may include any suitable oxide. Additionally, channel layer 409 may be composed of polysilicon. Although the embodiment depicted in FIG. 4 is described in relation to a non-volatile memory cell, similar layers and arrangements of layers may be used to fabricated selection gates, dummy non-volatile memory cells, or any other suitable devices included in a NAND string.

To connect a non-volatile memory cell to a word or other control line (e.g., one of word lines 130), additional materials may be employed. As illustrated, high-k material 405, metal barrier 404, and conductive metal 403 (e.g., tungsten) may be used to couple a word or other control line to a non-volatile memory cell.

As shown in vertical cross section 401, each of the aforementioned layers are cylindrical in shape forming a set of concentric cylinders around dielectric core 411. In various embodiments, layers with word or control line metallization, alternating with dielectric layers may be fabricated on a substrate. Once the layers have been fabricated, holes may be etched, and the materials forming the non-volatile memory cells deposited within the holes forming the aforementioned concentric cylinders.

During a program operation performed on non-volatile memory cell 400, charge (e.g., one or more electrons) is trapped in a portion of charge trap layer 407 associated with non-volatile memory cell 400. Such charge is drawn into charge trap layer 407 from channel layer 409 and through tunneling layer 408. In some embodiments, to enable such charge trapping, a programming voltage level may be applied to conductive metal 403 while channel layer 409 is held at or near ground potential; this programming voltage level is sufficiently large in order allowing electron tunneling from channel layer 409 to charge trap layer 407. The number of trapped electrons, which determine a threshold voltage of the non-volatile memory cell 400, may be determined by the voltage level applied to conductive metal 403 as well as a number of times the voltage level is applied to conductive metal 403.

The amount of charge trapped in charge trap layer 407 determines a threshold voltage for non-volatile memory cell 400. For example, the more charge that is trapped in charge trap layer 407, the higher the threshold voltage level of the memory cell device. In various embodiments, the threshold voltage may be set to one of multiple predetermined voltage levels, each of which corresponds to a particular data bit value or a value of a combination of multiple data bits During an erase operation, the trapped charge is drawn back into channel layer 409. In some cases, this may be accomplished be generating holes in channel layer 409. Electrons trapped in charge trap layer 407 migrate back through tunneling layer 408 to recombine with the generated holes. Alternatively, holes may migrate through tunneling layer 408 to recombine with electrons trapped in charge trap layer 407. As the electrons vacate charge trap layer 407, the threshold voltage of non-volatile memory cell 400 is reset to a voltage at or near ground potential.

Once the threshold voltage of non-volatile memory cell 400 has been programmed, conduction through the memory cell device is based on a voltage level applied to conductive metal 403 as compared to the previously set threshold voltage. If the voltage level applied to conductive metal 403 is less than the previously set threshold voltage, non-volatile memory cell 400 will not conduct current. For example, the resistivity of a portion of channel layer 409 associate with non-volatile memory cell 400 may be high (possibly mega-ohms or higher), which prevents conduction through that portion of channel layer 409. Alternatively, if the voltage level applied to conductive metal 403 is greater than or equal to the previously set threshold voltage, then non-volatile memory cell 400 will conduct current. The difference in conductivity of non-volatile memory cell 400 when a voltage level is applied at a predetermined level to conductive metal 403 can be used together with sensing at what voltage level the non-volatile memory cell 400 conducts to determine the value of data bit(s) stored in non-volatile memory cell 400 can be determined.

It is noted that the embodiment of FIG. 4 is merely an example. Many possible combinations of structures are materials may be used in fabricating selection gates included in three-dimensional non-volatile memory strings. For example, in some cases, the layered structure of insulating materials may include more than three layers, and the control terminal connection may be made from a nitride-based or other suitable material.

Figure 5:
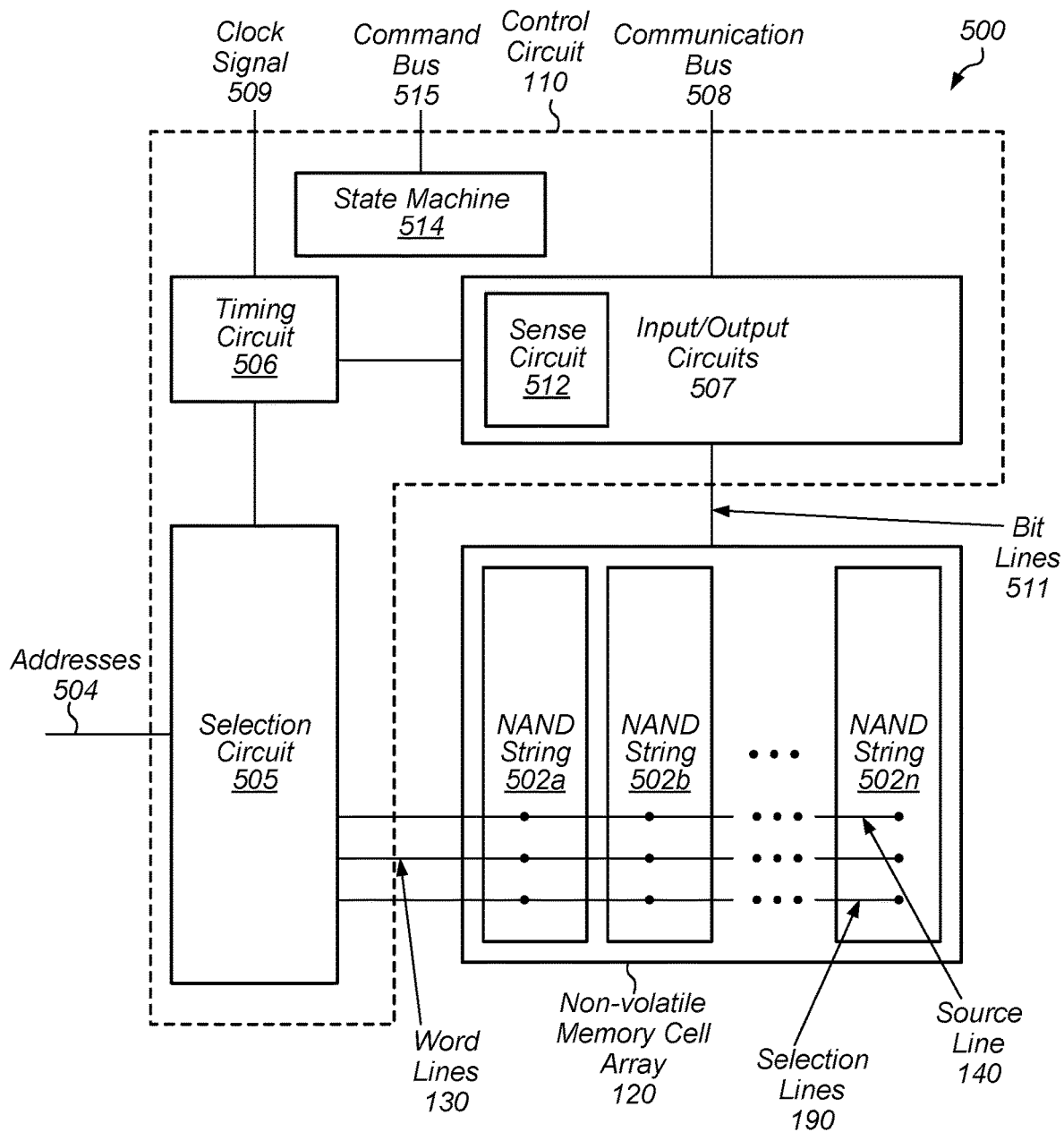
FIG. 5 illustrates a block diagram depicting an embodiment of a memory system.

Turning to FIG. 5, an embodiment of a non-volatile memory circuit 500 includes non-volatile memory cell array 120 and control circuit 110. Non-volatile memory cell array 120 includes NAND strings 502a-502n, and control circuit 110 includes timing circuit 506, state machine 514, input/output circuits 507, sense circuit 512 and selection circuit 505. These components are exemplary and are provided to generally describe operation of non-volatile memory circuit 500.

In various embodiments, each of NAND string 502a-502n may correspond to NAND string 200 as illustrated in FIG. 2 and may include multiple memory cell devices along with one or more selection gates. Although three NAND strings are depicted in the embodiment of FIG. 5, in other embodiments, any suitable number of NAND strings may be included in non-volatile memory cell array 120.

Selection circuit 505 is configured to receive and decode addresses 504. Based on a decode of addresses 504, selection circuit 505 may assert one or more of selection lines 190, word lines 130, and source lines 140. In some cases, different ones of selection lines 190, word lines 130, and source lines 140 may be asserted to different voltage levels. For example, during a read operation, selection circuit 505 may change the voltage levels of particular ones of word lines 130, selection lines 190, and source lines 140. As described above, multiple sensing operations may be performed as part of the read operation and selection circuit 505 may change the voltage levels of any of word lines 130, selection lines 190, and source lines 140 prior to a start of each of the sensing operations.

Input/output circuits 507 are configured to receive data from and transmit data via communication bus 508. In various embodiments, input/output circuits 507 may include data input latch circuits, output driver circuits, voltage level shifter circuits, and the like (all of which are not shown for clarity).

State machine 514 is a particular embodiment of a sequential logic circuit that is configured to track a number of sense operations included in a particular read operation as well as control other circuit blocks in non-volatile memory circuit 500 based on a state of command bus 515. In various embodiments, state machine 514 may include multiple counter and comparator circuits configured to track a number of sense operations that have been performed in response to a read operation. As each sense operation concludes, state machine 514 may send signals to selection circuit 505 in order to change voltage levels of word lines and/or source lines for the next sense operation to be performed using a different threshold voltage shift. State machine 514 may repeat these operations until the non-volatile memory cells have been sensed at all of the desired threshold voltage shifts.

Timing circuit 506 is configured to generate timing signals based on clock signal 509. The timing signals generated by timing circuit 506 are used by input/output circuits 507 as well as selection circuit 505 to control the duration of certain operations. For example, the duration of individual sense operations included as part of a read operation are controlled by the timing signals. As described above, pre-read operations used to determine a program state of a non-volatile memory cell adjacent to a non-volatile memory cell to be sensed in a read operation may be employed by non-volatile memory circuit 500. In such cases, the duration of such a pre-read operation may be determined by the timing signals generated by timing circuit 506.

In addition to receiving and sending data, input/output circuits 507 are also configured to determine data stored in memory cell devices included in NAND strings 502a-502n using bit lines 511. Input/output circuits 507 include sense circuit 512, which as described below in more detail, is used to compare voltage levels of a particular one of bit lines 511, generated using different voltage levels on source lines 140, to reference voltage levels in order to determine data stored in non-volatile memory cells included in NAND strings 502a-502n. In some embodiments, sense circuit 512 is also configured to determine a program state of a non-volatile memory cell adjacent to a particular non-volatile memory cell to be sensed.

Figure 6:
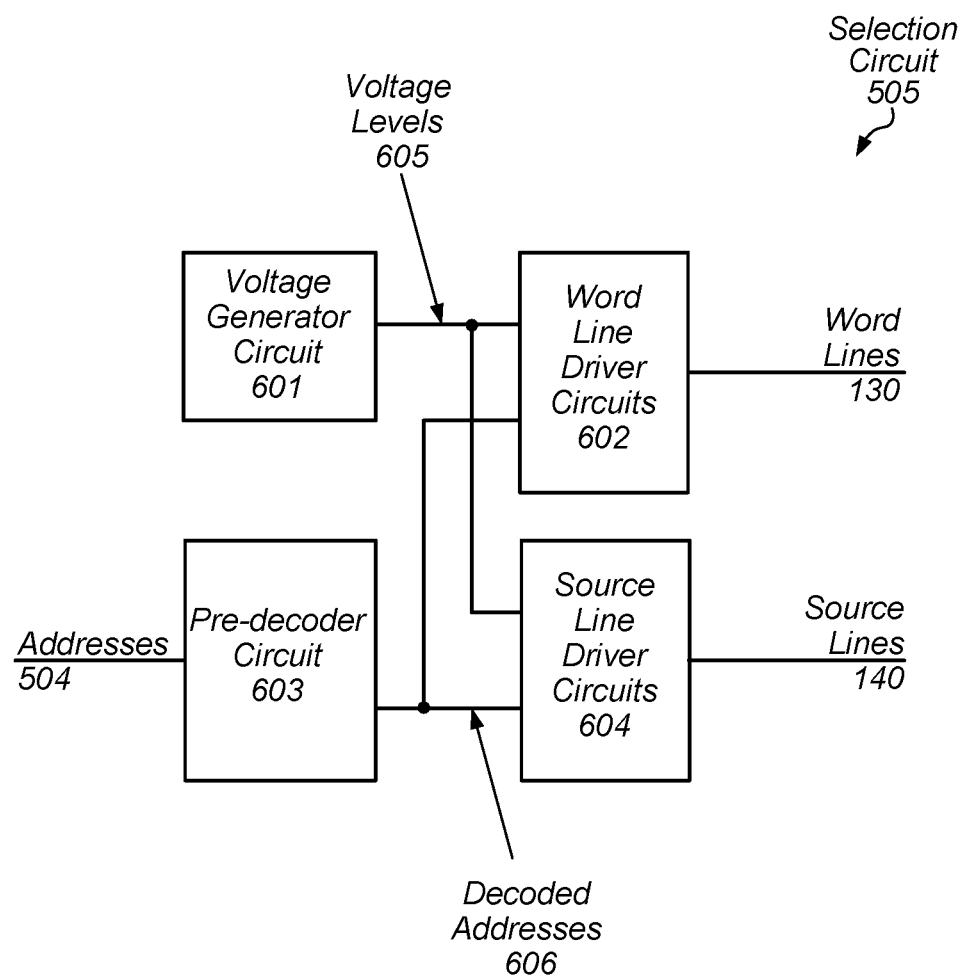
FIG. 6 illustrates a block diagram depicting an embodiment of a selection circuit.

An embodiment of selection circuit 505 is depicted in FIG. 6. As illustrated, selection circuit 505 includes voltage generator circuit 601, pre-decoder circuit 603, word line driver circuits 602, and source line driver circuits 604.

In various embodiments, voltage generator circuit 601 may include voltage reference circuits, such as band gap reference circuits, voltage regulator circuits, as well as circuits configured to control the operation of such circuits. Voltage generator circuit 601 is configured to generate voltage levels 605. In various embodiments, voltage levels 605 include voltages corresponding to possible threshold voltages to which non-volatile memory cells may be programmed, as well as different voltage levels that may be used in conjunction with source lines in the non-volatile memory array to modulate threshold voltages of non-volatile memory cells during the reading process. Additionally, voltage generator circuit 601 may be configured to generate voltage levels used during program operations and erase operations of the non-volatile memory cells.

Pre-decoder circuit 603 may include any suitable combination of dynamic or static logic circuits configured to generate decoded addresses 606 using addresses 504 according to a desired decoding algorithm. It is noted that pre-decode circuit 603 may use only a portion of data bits included in addresses 504 and that the remaining data bits may be used as part of a column decode to select particular ones of multiple NANDs strings included in the memory array.

Word line driver circuit 602 includes multiple driver circuits configured to selectively generate voltage levels on word lines 130 based on decoded addresses 606 and using voltage levels 605. For example, word line driver circuit 602 may set a particular word line of word lines 130 to an initial voltage level to allow for the programed state of a non-volatile memory cell coupled to the particular one of word lines 130 to be determined.

Once the program state has been determined, word line driver circuits 602 may change the voltage level of the particular word line, as well as set a voltage level of a different word line coupled to an adjacent non-volatile memory cell to multiple levels to allow for determining data values stored in the adjacent non-volatile memory cell. It is noted that word line driver circuits 602 is configured to transition the voltage level of the particular word line from the initial voltage level to a new voltage level without first discharging the particular word line to ground, as would occur during a pre-charge operation.

In a similar fashion, source line driver circuits 604 includes multiple driver circuits configured to change respective voltage levels of source lines 140. As described above, multiple sensing operations may be performed on a non-volatile memory cell, each using a different voltage level on a source line coupled to a NAND string including the non-volatile memory cell. As each sensing operation is completed, source line driver circuits 604 transitions the source line to a new voltage level by selecting a different one of voltage levels 605. It is noted that in some embodiments, the combination of word line and source line voltage levels used during the various sensing operations are sequenced to minimize or reduce a number of transitions in the respective voltage levels.

Figure 7:
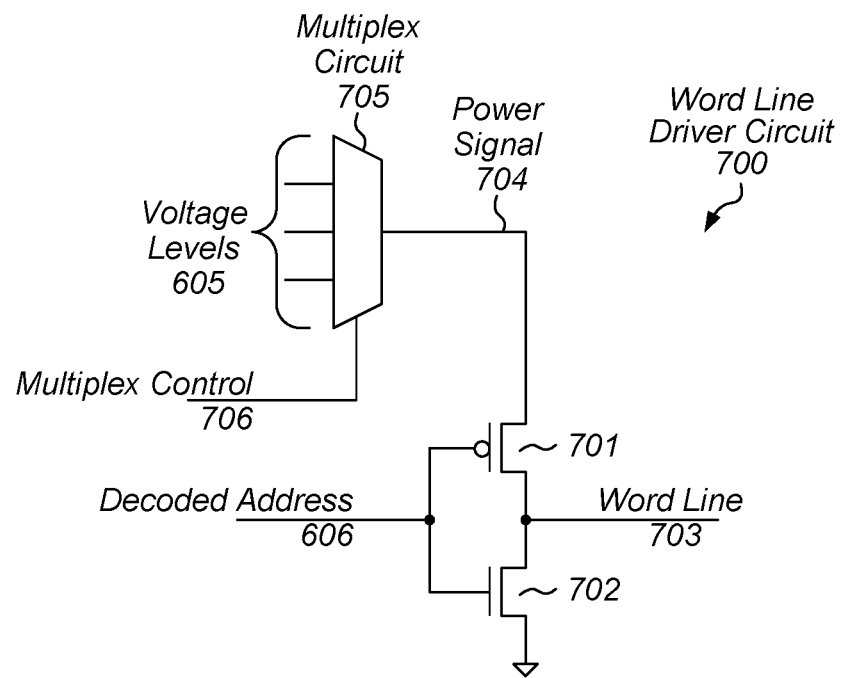
FIG. 7 illustrates a diagram of a word line driver circuit.

Turning to FIG. 7, a diagram of a word line driver circuit is illustrated. In various embodiments, word line driver circuit 700 may correspond to one of the word line driver circuits included in word line driver circuits 602 as depicted in FIG. 6. It is noted that similar circuits may be used for source line driver circuits 604. As illustrated, word line driver circuit 700 includes device 701, device 702, and multiplex circuit 705.

Device 701 is coupled between power line 704 and word line 703, and device 702 is coupled between word line 703 and a ground signal. Word line 703 may, in some embodiments, correspond to one of word lines 103. Control terminals of each of devices 701 and 702 are coupled to decoded addresses 606. It is noted that devices 701 and 702 may be particular embodiments of metal-oxide semiconductor field-effect transistors (MOSFETs); in other embodiments, any suitable variety of transconductance device may be employed.

During operation, device 701 may, based on a value of decoded addresses 606, allow current to flow from power line 704 to word line 703, thereby charging word line 703 to a voltage substantially the same as that of power line 704. For example, if a particular one of decoded addresses 606 is a low logic level, then device 701 will be active and allow current to flow onto word line 703. Alternatively, if a particular one of decoded addresses 606 is at a high logic level, device 701 will be inactive and device 702 will be active, providing a discharge path from word line 703 to ground.

Multiplex circuit 705 is coupled to voltage levels 605, multiplex control signal 706, and power line 704 and is configured to select a particular one of voltage levels 605 based on multiplex control signal 706. The selected one of voltage levels 605 is coupled to power line 704, thereby changing a voltage level of power line 704 to that of the selected one of voltage levels 605. By selecting different voltage levels, as described above, the voltage level of word line 703 can assume different voltage levels as part of the execution of different commands by a memory circuit.

Figure 8:
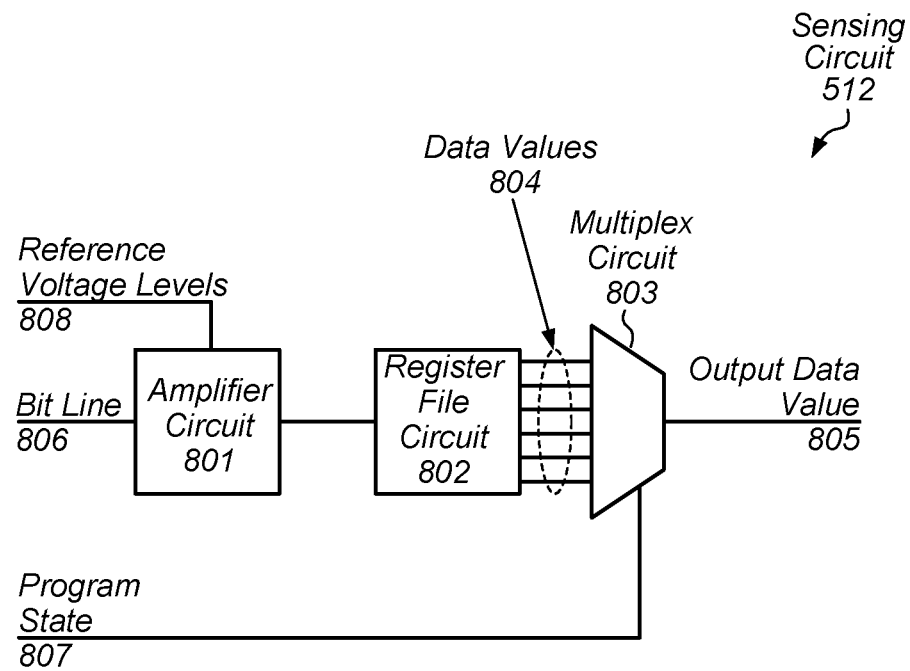
FIG. 8 illustrates a block diagram depicting an embodiment of a sensing circuit.

Turning to FIG. 8, a block diagram of an embodiment of sensing circuit 512 is depicted. As illustrated, sensing circuit 512 includes amplifier circuit 801, register file circuit 802, and multiplex circuit 803.

In the embodiment shown, amplifier circuit is coupled to bit line 806 and reference voltage levels 808, and is configured to sequentially compare a voltage level of bit line 806 to reference voltage levels 808. In various embodiments, reference voltage levels 808 may correspond to different program states of a non-volatile memory cell coupled to bit line 806. By comparing the voltage level of bit line 806, data values stored in the non-volatile memory cell may be determined.

In various embodiments, amplifier circuit 801 may be a particular embodiment of a differential amplifier circuit, or any other suitable amplifier circuit configured to generate an output signal based on a comparison of voltage levels of at least two inputs. In some cases, amplifier circuit 801 may include an analog-to-digital converter (ADC) circuit to generate data bits that correspond to a voltage level of an output signal of amplifier circuit 801.

As described above, when different source line voltage levels are used, amplifier circuit 801 is configured to sequentially generate data values, which are stored in register file circuit 802. Register file circuit 802 may include multiple data storage circuits configured to store data bits corresponding the data values generated by amplifier circuit 801. For example, in some embodiments, register file circuit 802 may include multiple latch or flip-flop circuits.

Data values 804 are coupled to inputs of multiplex circuit 803. As described above, a value of program state 807 is used by multiplex circuit 803 to select a particular one of data values 804 stored in register file circuit 802 to generate output data value 805. It is noted that although program state 807 is depicted as a single signal, in other embodiments, program state 807 may include multiple data bits that can encode not only if an adjacent non-volatile memory cell is programmed, but also the state to which the adjacent non-volatile state is programmed.

Multiplex circuit 803 may be designed according to various circuit techniques. For example, in some cases, multiplex circuit 803 may be constructed from multiple pass gates coupled together in a wired-OR fashion. Alternatively, multiplex circuit 803 may include multiple static logic gates arranged to implement the desired selection function.

It is noted that the embodiment depicted in FIG. 8 is merely an example and that some circuit blocks, such as ADC circuits, have been omitted for clarity.

Figure 9A:
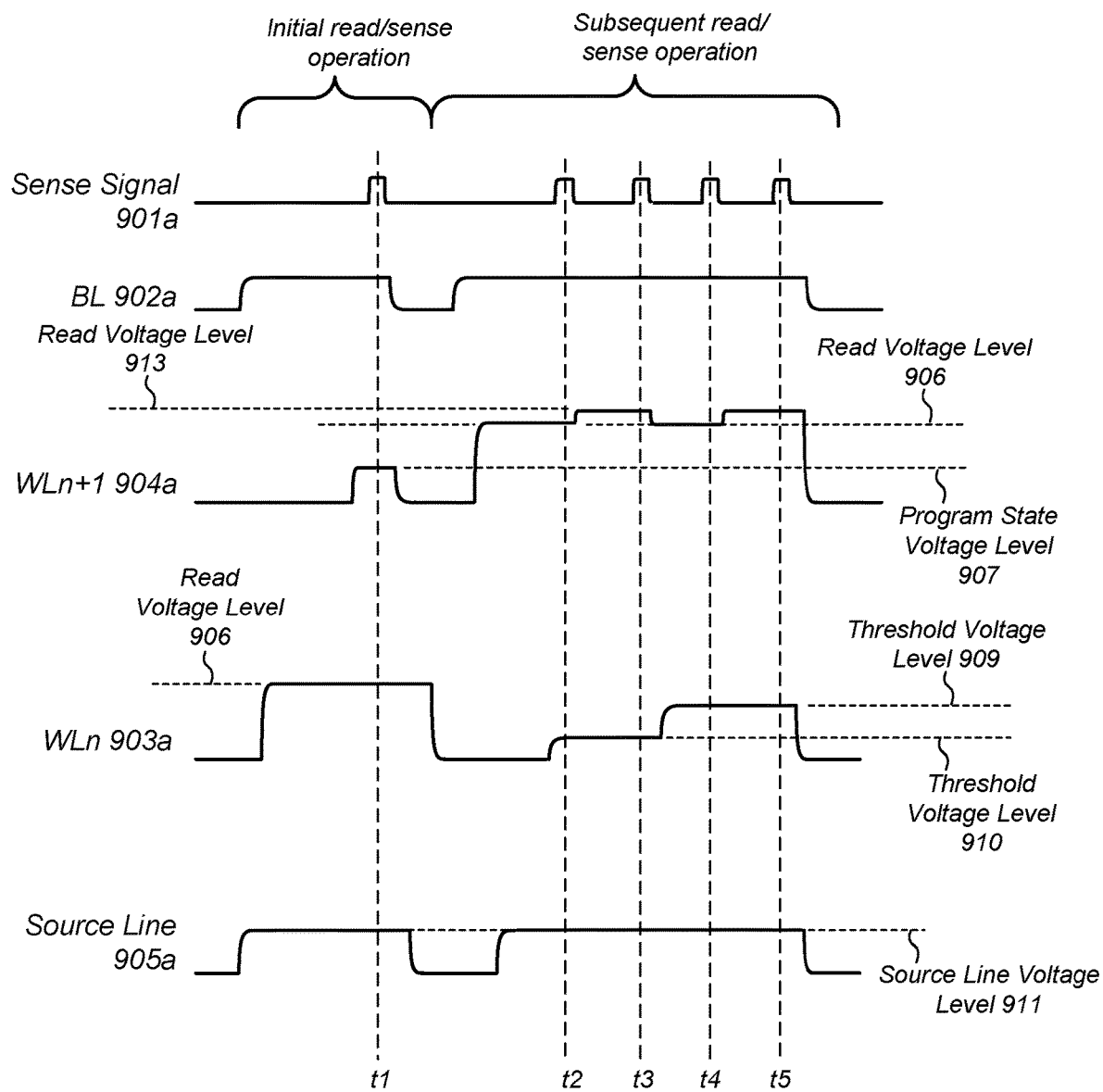
FIG. 9A illustrates prior art waveforms depicting a data look-ahead read operation.

As described above, DLA read operations may be used to compensate for charge loss in a particular non-volatile memory cell by determining a program state of another non-volatile memory cell adjacent to the non-volatile memory cell (i.e., an "adjacent memory cell") and adjusting the threshold voltage of the non-volatile memory cell during subsequent read or sense operations based on the determined program state of the adjacent non-volatile memory cell. Multiple techniques may be used to perform a DLA operation. A set of waveforms for one such previous method are illustrated in FIG. 9A.

As illustrated, the waveforms depict a look-ahead read or sense operation of a particular non-volatile memory cell coupled to a particular word line and bit line. The look-ahead read or sense operation includes two parts: an initial read or sense operation of a adjacent non-volatile memory cells coupled to a word line adjacent to the particular word line, and a subsequent read or sense operation of the particular non-volatile memory cell coupled to the particular word line. The subsequent read or sense operation may include multiple sensing operations of the particular non-volatile memory cell using respective different conditions. It is noted that although the description that follows is directed to a particular NAND string coupled to a particular bit line these look-ahead read or sense operations may be performed in parallel on multiple NAND strings.

BL 902a depicts the voltage level as a function of time of one of bit lines 511 that is coupled to both the particular non-volatile memory cell and the adjacent non-volatile memory cell. In a similar fashion, WLn 903a and WLn+1 904a correspond to voltage levels of two of word lines 130, where WLn+1 904a is coupled to the particular non-volatile memory cell and WLn 903a is coupled to the adjacent non-volatile memory cell, with each non-volatile memory cell connected to the same bit line. Source line 905a corresponds to any of source lines 140a that is coupled to the NAND string including the given and the other non-volatile memory cells, and sense signal 901a corresponds to a read or sense operation.

As part of the initial read operation, the program state of the adjacent non-volatile memory cells is determined at time t1. As noted above, the exact value of the threshold voltage the adjacent non-volatile memory cell does not have to be determined, but merely an indication if the adjacent non-volatile memory cell has been programmed to a high or low threshold value. To accomplish this, program state voltage level 907 may be selected to be in the middle of the range of possible threshold voltage values to which the adjacent non-volatile memory cell may be programmed.

To determine the program state of adjacent non-volatile memory cell, BL 902a is pre-charged to a particular voltage level (commonly referred to as a "pre-charge level"). For example, in some embodiments, the voltage level of BL 902a may be set to a voltage level substantially the same as or lower than the voltage level of a power supply of the non-volatile memory. In order to determine if the adjacent non-volatile memory cell conducts with WLn+1 904a set to program state voltage level 907, and with other word lines, including WLn 903a, that are coupled to other non-volatile memory cells on the same bit line, set to read voltage level 906. With the other non-volatile memory cells in a conductive state, the voltage level of BL 902a is determined by whether or not the adjacent non-volatile memory cell conducts with the program state voltage level 907 applied to its control terminal.

Once the program state of the adjacent non-volatile memory cell has been determined (e.g. a high Vt value or a low Vt value) the initial read or sense operation has completed, allowing the subsequent read or sense operation to commence after another pre-charge operation in which the voltage levels of BL902a, source line 905a, WLn 903, and WLn+1 904 are set to a voltage level at or near ground potential. Prior to starting the subsequent read or sense operation, the voltage level of BL902a is again set to its pre-charge voltage level.

During the subsequent read or sense operation, the particular non-volatile memory cell may be sensed multiple times with different respective threshold voltage adjustments. Once the multiple sense operations have been completed, a final sense value for the particular non-volatile memory is selected based on whether the adjacent non-volatile memory cell is programmed with a high Vt or low Vt.

As the subsequent read or sense operation begins, a sense operation of the particular non-volatile memory cell is then performed at time t2. This sense operation is performed with the voltage level of WLn+1 904 (as well as other unselected word lines) set to read voltage level 906 and the voltage level of WLn 903a at threshold voltage level 910, which may correspond to a particular program state (i.e., a particular set of value(s) of data stored in the particular non-volatile memory cell). The results from the sensing operation may be stored in a register file or other suitable storage circuit. Another sense operation is performed at time t3 with the voltage level of WLn+1 904a set to read voltage level 913. In various embodiments, read voltage level 913 is selected to induce a negative shift in the threshold voltage of the particular non-volatile memory cell. It is noted that, in some cases, read voltage level 913 may be sufficiently large to induce long-term reliability issues for some non-volatile memory cells, as well as disturbing other neighboring non-volatile memory cells. As before, the results from this sense operation may be stored in the register file circuit.

Following the completion of this sense operation, the voltage level of WLn+1 904a is returned to read voltage level 906 and the voltage level of WLn 903a is set to threshold voltage level 909. Another sense operation is then performed on the particular non-volatile memory cell at time t4 and the results stored in the register file circuit. A final sense operation is performed at time t5 with the voltage level of WLn+1 904a set to read voltage level 913 and the voltage level of WLn 903a remaining at threshold voltage level 909. It is noted that during the sense operations included in the subsequent read or sense operations, the voltage level of source line 905a remains constant at source line voltage level 911.

After the last sense operation has been performed, the non-volatile memory circuit determines the threshold value to which the particular non-volatile memory cell is programmed using the previously sensed values along with the program state of the adjacent non-volatile memory cell. For a given one of the two threshold voltage levels applied to WLn 903a, a given one of the two values sense at those voltage levels, one for each voltage level of WLn+1 904a, is selected based on the program state the adjacent non-volatile memory cell. For example, if the adjacent non-volatile memory cell is at a high Vt program state, then the values corresponding to read voltage level 913 may be selected.

As noted above, using a DLA read operation can compensate for threshold shifts in non-volatile memory cells. Such DLA read operations, however, may increase response time to read requests as well as generate read disturb problems and reliability issues. The waveforms illustrated in FIG. 9B, depict the operation of a memory circuit performing a DLA read which may reduce response time to read requests, and remediate the aforementioned read disturb and reliability issues.

Figure 9B:
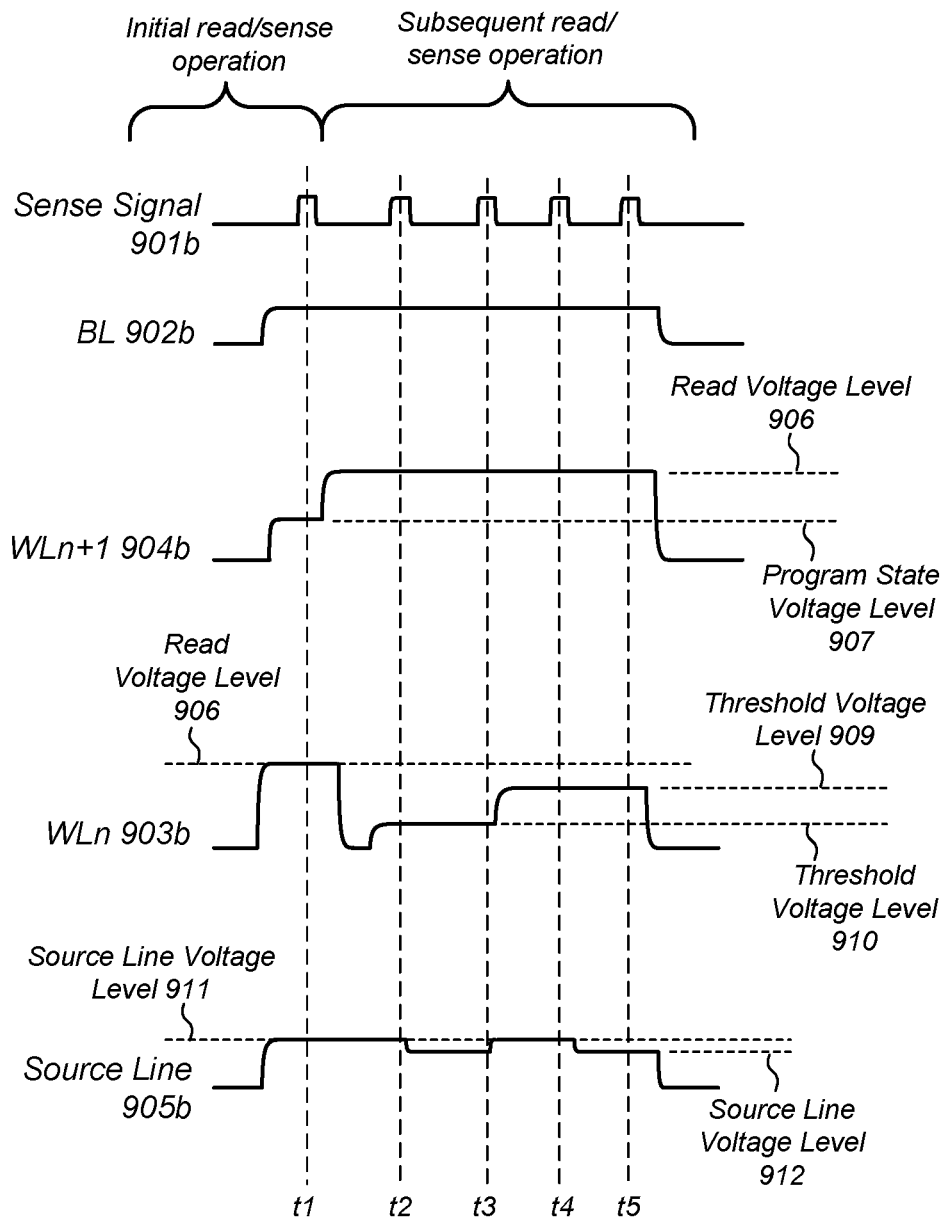
FIG. 9B illustrates example waveforms depicting a data look-ahead read operation according to one embodiment of the claimed invention.

As with FIG. 9A, the waveforms in FIG. 9B depict both an initial sense or read operation followed by a subsequent read or sense operation of the particular non-volatile memory cell coupled to the particular word line. In a similar fashion to FIG. 9A, the subsequent read or sense operation includes multiple sensing operations of the particular non-volatile memory cell using respective different conditions, some of which can shift artificially shift the threshold voltage of the particular non-volatile memory cell. It is noted that although the description that follows is directed to a particular NAND sting coupled to a particular bit line, but that such look-ahead read or sense operations may be performed, in parallel, on multiple NAND strings.

BL 902b may depict the voltage level as a function of time of one of bit lines 511 coupled to both the particular non-volatile memory cell and the adjacent non-volatile memory cell. In a similar fashion, WLn 903b and WLn+1 904b may correspond to voltage levels of two of word lines 130, where WLn+1 904b is coupled to the particular non-volatile memory cell and WLn 903b is coupled to the adjacent non-volatile memory cell, each non-volatile memory cell connected to the same bit line. Source line 905b may correspond to any of source lines 140 that is coupled to the NAND string including the given and the other non-volatile memory cells, and sense signal 901 may corresponds to a read or sense operation.

During the initial read operation (also referred to as a "pre-read operation"), BL 902b is pre-charged to a particular voltage level (commonly referred to as a "precharge level"). For example, in some embodiments, the voltage level of BL 902b may be set to a voltage level substantially the same as the voltage level of a power supply of the non-volatile memory. Additionally, WLn 903b is set to read voltage level 906 and WLn+1 90b4 is set to read program state voltage level 907. In a similar fashion, source line 905b is set to source line voltage level 911.

As with FIG. 9A, the exact value of the threshold voltage the adjacent non-volatile memory cell does not have to be determined, but merely an indication if the adjacent non-volatile memory cell has been programmed to a high or low threshold value. To accomplish this, program state voltage level 907 is selected to be in the middle of the range of possible threshold voltage values to which the adjacent non-volatile memory cell may be programmed. In order to determine if the adjacent non-volatile memory cell conducts with WLn+1 904b set to program state voltage level 907, other word lines, including WLn 903b, coupled to other non-volatile memory cells on the same bit line, is set to a sufficiently high voltage level (commonly referred to as a "read voltage" and denoted by read voltage level 906) to allow the other non-volatile memory cells to conduct, no matter their respective programmed threshold voltage levels are. With the other non-volatile memory cells in a conductive state, the voltage level of BL 902b is determined by whether or not the adjacent non-volatile memory cell conducts with the program state voltage level 907 applied to its control terminal.

Once the voltage levels reach the target levels, at time t1, a sensing operation is performed by checking whether the voltage level of BL 902b discharges from the pre-charge level. For example, if the adjacent non-volatile memory cell is programmed with a low threshold value, then program state voltage level 907 is sufficient to cause the adjacent non-volatile memory cell to conduct, thereby discharging BL 902b. If BL 902b discharges, then sense circuit 512 can determine that the adjacent non-volatile memory cell was programmed with a low threshold value. Alternatively, if BL 902b does not discharge, then sense circuit 512 can determine that the adjacent non-volatile memory cell is programmed with a high threshold value. It is noted that for the purposes of illustration, BL 902b is shown as not discharging, but this is just one example. It is further noted that the above example uses a particular one of many possible sensing techniques and in other embodiments, different sensing techniques may be employed. For example, in some cases, the current flowing through the bit line may be used to discharge a sense capacitor and the voltage level of the sense capacitor is compared to a reference voltage level.

Once the program state of the adjacent non-volatile memory cell has been determined (e.g. a high Vt value or a low Vt value) the initial read or sense operation has completed and, the subsequent read or sense operation can commence. During the subsequent read or sense operation, the particular non-volatile memory cell may be sensed multiple times with different respective threshold voltage adjustments. Once the multiple sense operations have been completed, a final sense value for the particular non-volatile memory is selected based on whether the adjacent non-volatile memory cell is programmed with a high Vt or low Vt.

At the start of the subsequent read or sense operation, WLn+1 904b transitions from its initial value of program state voltage level 907 to a modified value of read voltage level 906, which is sufficient to cause the adjacent non-volatile memory cell to conduct no matter the programmed value of its threshold voltage. It is noted that WLn+1 904b transitions directly to the modified voltage level without an intervening pre-charge operation in which the voltage level would be set to ground. By transitioning the WLn+1 904b is this fashion, a delay associated with a pre-charge operation (as shown above in FIG. 9A) may be reduced or eliminated, thereby reducing read response time of the non-volatile memory circuit and allowing for improved performance of a computer system that includes the non-volatile memory circuit.

At the same time WLn+1 904b is being transitioned, WLn 903b is also transitioned to a new voltage level. As illustrated, WLn 903b is discharged to ground, then transitioned to threshold voltage level 910. Once WLn 903b has reached threshold voltage level 910, two sensing operations are performed, one at time t2 and the other at time t3 and the respective results stored in a register file or other suitable circuit. The first sensing operation is performed with source line 905b at source line voltage level 911, and the second sensing operation is performed with source line 905b at source line voltage level 912. The change in source line voltage level modifies the effective threshold voltage of the particular non-volatile memory cell being sensed. By using different source line voltages, the particular non-volatile memory cell can be sensed with different effective threshold voltages. In contrary to the method illustrated in FIG. 9A, inducing such modifications in the threshold voltages of a non-volatile memory cell using modified source line voltage levels is not expected to result in reliability issues for the non-volatile memory cells coupled to the adjacent word line.

After the first two sensing operations are performed, two more sensing operations are performed at times t4 and t5, and their respective results are also stored in the register file or other suitable circuit. Prior to starting the next sensing operation, WLn 903b transitions to threshold voltage level 910, where each of the sense operations is again performed with different voltage levels on source line 905b to determine if the either of the adjusted threshold voltages resulting from the different voltage levels on source line 905b match threshold voltage level 910. Each of the sensing operations of the non-volatile memory cell may be triggered by clock signal 901b. As a further improvement to performance, the voltage level transitions of source line 905b may be arranged to minimize or reduce the number of voltage level transitions over the multiple sense operations.

It is noted that in the illustrated waveforms, for each voltage level of WLn 903b, two sensing operations are performed using respective different source line voltage levels. In other embodiments, any suitable number of source line voltage levels may be employed for additional granularity in the shift of a non-volatile memory cell's effective threshold voltage. It is further noted that although only two voltage levels for WLn 903b are depicted as being used during the subsequent read or sense operations, in other embodiments, any suitable number of voltage levels may be used to allow for the storage of multiple data bits in a non-volatile memory cell. For example, in 2-bit per cell technology, the number of voltage levels can be 1 or 2; in 3-bit per cell technology, the number of voltage level can be 1 or 2 or 3; in 4-bit per cell technology, the number of voltage level can be 3 or 4.

Once all of the sensing operations have been completed sense circuit 512 may select a particular one of the values stored in the register filer or other suitable circuit based on the previously determined program state of the adjacent non-volatile memory cell. At the completion of the subsequent read or sense operation, the word lines, bit lines, and source lines are returned to a voltage level at or near ground potential.

It is noted that the waveforms depicted in FIGS. 9A and 9B are merely examples. In other embodiments, the shapes of the waveforms may be different due to different circuit implementations as well as effects of parasitic circuit elements.

Figure 10:
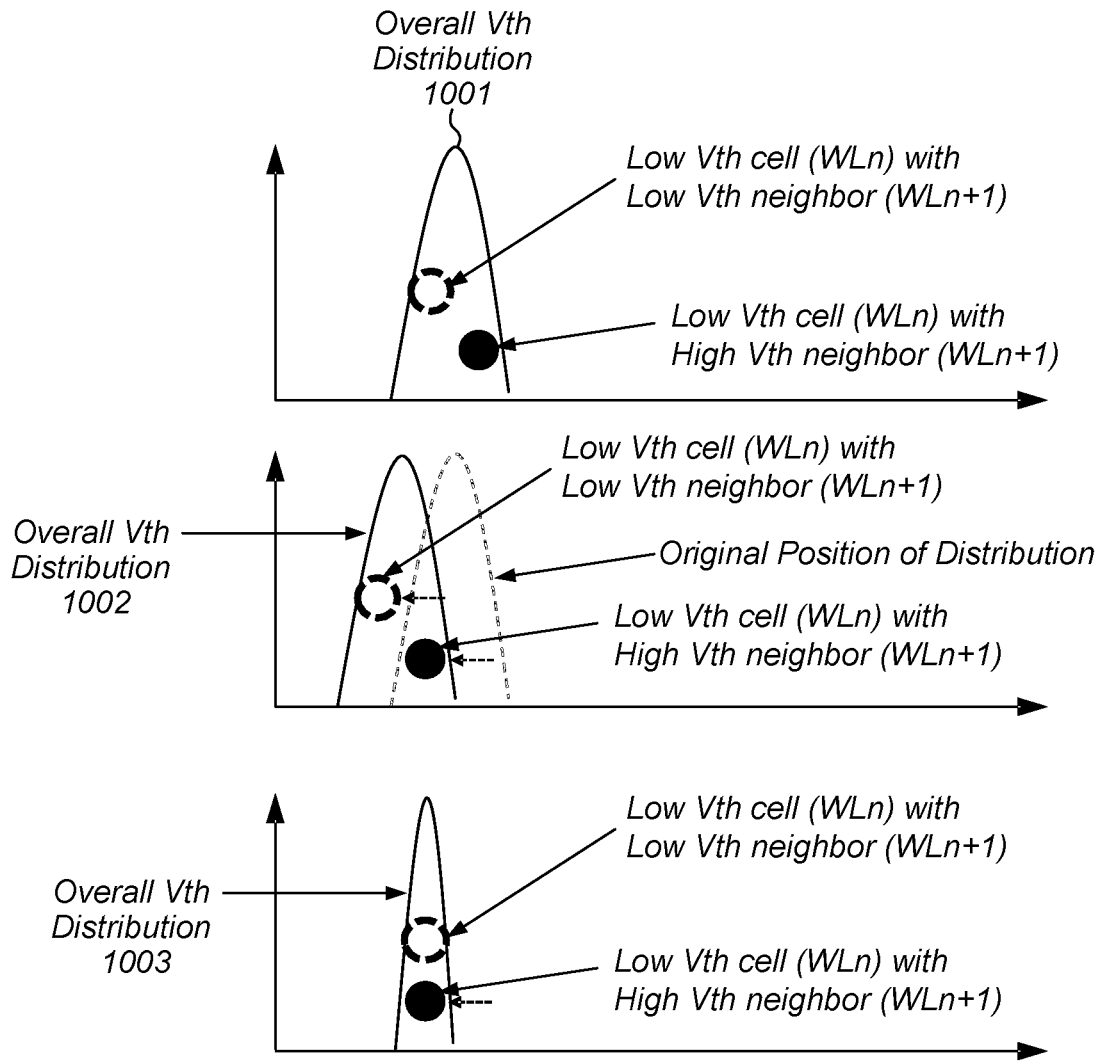
FIG. 10 illustrates threshold voltage distributions under different source line bias conditions.

As described above, changing the voltage level of the source line can adjust the threshold voltage of a non-volatile memory cell for the purpose of performing DLA reads. An example, of how threshold voltages are modified under different source line bias conditions is depicted in the threshold voltage distributions of FIG. 10.

Overall Vth distribution 1001 illustrates the overall threshold voltage distribution for a group of non-volatile memory cells when the voltage level of the source line corresponds to source line voltage level 911. Due to the effects of neighbor WL interference effect or LCL, apparent threshold voltage of low Vth non-volatile memory cell with a high Vth neighbor non-volatile memory cell appears higher. This apparent threshold of the low Vth cell with a high Vth neighbor non-volatile memory cell results in a widening of the overall distribution. When selecting an output from the multiple different values generated during a DLA read or sense operation, the result from low Vth non-volatile with a low Vth neighbor non-volatile cell will be chosen.

Overall Vth distribution 1002 illustrates the overall threshold voltage distribution for a group of non-volatile memory cells when the voltage level of the source line corresponds to source line voltage level 912. In this case, the non-volatile memory cells experience a higher Vds (drain-to-source voltage) and higher Vgs (gate-to-source voltage), which results in an apparent downward shift of the distribution for the original threshold position. If the non-volatile memory cell being sense is a low Vth non-volatile memory cell with a high Vth neighbor non-volatile memory cell, then the value using source line voltage level 912 will be chosen as the output value.

By using the two sense line voltage levels, the apparent distribution of the threshold voltages of the non-volatile memory cells is reduced in width. An example of this is shown in overall Vth distribution 1003. By using the source line voltages in this manner, the choice of which result to use in the multiple results generated during a DLA read is improved.

Figure 11:
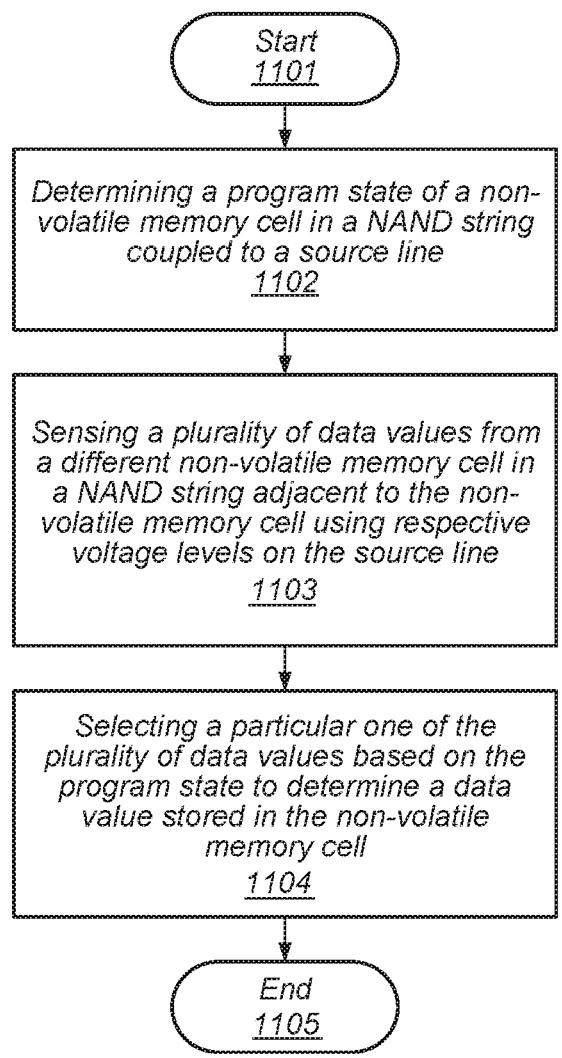
FIG. 11 illustrates a flow diagram depicting an embodiment of a method for performing a data look-ahead read on a memory circuit.

Turning to FIG. 11, a flow diagram depicting an embodiment of a method for performing a data look-ahead read on a memory circuit is illustrated. The method, which begins in block 1101, may be applied to non-volatile memory circuit 100 or any other suitable memory circuit.

The method includes determining a program state of a non-volatile memory cell included in a NAND string coupled to a source line (block 1102). In various embodiments, a word line signal coupled to the non-volatile memory cell may be set to a voltage level sufficient to determine if the non-volatile memory cell has been programmed up to a particular predetermined voltage level. A voltage level of a bit line coupled to the NAND string may be compared to one or more of reference voltage levels 808 by sensing circuit 512 to detect the non-volatile memory cell has been programmed. It is noted that in some embodiments, the determined program state may include additional information, such as what state the non-volatile memory cell has been programmed to, rather than just an indication of whether or not the non-volatile memory cell has been programmed.

In some cases, the method includes, setting, prior to determining the program state of the non-volatile memory cell, respective initial voltage levels of a control line coupled to the non-volatile memory cell and a different control line coupled to a different non-volatile memory cell. As described above, the initial voltage level of the word line may be less than the initial voltage of the different word line.

After determining the program state of the non-volatile memory cell and prior to sensing the plurality of values from the different non-volatile memory cell, the method may include modifying, without an intervening pre-charge cycle, the respective initial voltage levels of the control line and the different control line to generate respective modified voltage levels of the control line and the different control line. By not employing an intervening pre-charge cycle, an overall time associated with the read operation may be reduced, thereby improving performance of a computer system including the memory circuit. It is noted that in some cases, the modified voltage level of the word line is greater than the initial voltage level of the word line.

The method also includes sensing a plurality of data values from the nonvolatile memory cell in a NAND string using respective voltage levels on a source line coupled to the NAND string (block 1103). For example, non-volatile memory circuit 500 may perform multiple cycles, each using a different voltage level on one of source lines 513. Sensing circuit 512 may, in turn, compare resultant bit line voltages from the multiple cycles to reference voltages levels 808. A result of each comparison may be stored in register file circuit 802.

In some cases, sensing the plurality of data values from the different non-volatile memory cell includes sensing a first set of data values of the plurality of data values using a first voltage level on the different word line and a plurality of voltage levels on the source line and sensing a second set of data values of the plurality of data values using a second voltage level on the different control line and the plurality of voltage levels on the source line. Sensing the plurality of data values may, in some embodiments, include comparing a voltage level of a bit line coupled to the NAND string to at least one of a plurality of reference voltage levels.

The method also includes selecting a particular one of the plurality of data values based on the program state to determine a data value stored in the non-volatile memory cell (block 1104). For example, multiplex circuit 803 may, using program state 807, select a particular one of data values 804 that are stored register file circuit 802. The method ends in block 1105.

It is noted that the embodiment of the method depicted in FIG. 11 is merely an example. In other embodiments, different operations and different orders or operations are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   an array of non-volatile memory cells including a first non-volatile memory cell coupled to a first word line and a second non-volatile memory cell coupled to a second word line adjacent to the first word line;
   a source line coupled to the first non-volatile memory cell and the second non-volatile memory cell; and
   a control circuit configured to:
      sense multiple values from the first non-volatile memory cell using different voltage levels on the source line; and select one of the multiple values as an output of the first non-volatile memory cell based on a program state of the second non-volatile memory cell.

2. The apparatus of claim 1, wherein the control circuit is further configured to, prior to sensing the multiple values from the first non-volatile memory cell, set the first and second word lines to respective initial voltage levels and determine the program state of the second non-volatile memory cell using the respective initial voltage levels of the first and second word lines.

3. The apparatus of claim 2, wherein the control circuit is further configured to set the first word line to an initial voltage level that is greater than an initial voltage level of the second word line.

4. The apparatus of claim 2, wherein the control circuit is further configured to, after determining the program state of the second non-volatile memory cell and prior to sensing the multiple values from the first non-volatile memory cell, modify, without an intervening pre-charge cycle, the respective initial voltage levels of the first and second word lines to generate respective modified voltage levels on the first and second word lines.

5. The apparatus of claim 4, wherein the control circuit is further configured to set the second word line to a modified voltage level that is greater than an initial voltage level of the second word line.

6. The apparatus of claim 1, wherein to sense the multiple values from the first non-volatile memory cell, the control circuit is further configured to sense a first value using a first voltage level on the source line and sense a second value using a second, different voltage level on the source line.

7. A system, comprising:
a plurality of non-volatile memory cell strings including a particular non-volatile memory string coupled to a source line and that includes a first non-volatile memory cell coupled to a first word line and a second non-volatile memory cell coupled to a second word line;
a driver circuit configured to:
set the first word line and the second word line to respective initial voltage levels during a particular memory access cycle; and
in a subsequent memory access cycle, and without an intervening pre-charge cycle, modify the respective initial voltage levels of the first word line and the second word line to sense a data value in the first non-volatile memory cell; and
a sense circuit configured to:
determine a program state of the second non-volatile memory cell coupled to the second word line during the particular memory access cycle;
sense multiple data values from the first non-volatile memory cell using respective voltage levels of the source line; and
select a particular one of the multiple data values using the program state of the second non-volatile memory cell to determine the data value stored in the first non-volatile memory cell.

8. The system of claim 7, wherein the driver circuit is further configured to set the second word line to a modified voltage level greater than an initial voltage level of the second word line.

9. The system of claim 7, wherein to sense the multiple data values from the first non-volatile memory cell, the sense circuit is further configured to sense a first data value using a first voltage level of the source line and sense a second data value using a second voltage level on the source line.

10. The system of claim 7, wherein the particular non-volatile memory string is further coupled to a bit line.

11. The system of claim 10, wherein to sense the multiple data values from the first non-volatile memory cell, the sense circuit is further configured to compare a voltage level of the bit line to a plurality of reference voltage levels, wherein the voltage level of the bit line is based on a particular voltage level on the source line.

12. The system of claim 7, wherein the driver circuit is further configured to set the second word line to an initial voltage level greater than an initial voltage level of the second word line.

13. The system of claim 7, wherein the sense circuit is further configured to store the multiple data values in a register file circuit prior to selecting the particular one of the multiple data values.

14. A method, comprising:
determining a program state of a non-volatile memory cell included in a NAND string that is coupled to a source line;
sensing a plurality of data values from a different non-volatile memory cell adjacent to the non-volatile memory cell in the NAND string using respective voltage levels on the source line; and
selecting, based on the program state, a particular one of the data values to determine a data value stored in the different non-volatile memory cell.

15. The method of claim 14, further comprising, prior to determining the program state of the non-volatile memory cell, setting respective initial voltage levels of a word line coupled to the non-volatile memory cell and a different word line coupled to the different non-volatile memory cell.

16. The method of claim 15, wherein an initial voltage level of the word line is less than an initial voltage level of the different word line.

17. The method of claim 15, further comprising, after determining the program state of the non-volatile memory cell, and prior to sensing the plurality of data values from the different non-volatile memory cell, modifying, without an intervening pre-charge cycle, the respective initial voltage levels of the word line and the different word line to generate respective modified voltage levels of the word line and the different word line.

18. The method of claim 17, wherein a modified voltage level of the word line is greater than an initial voltage level of the word line.

19. The method of claim 15, wherein sensing the plurality of data values from the different non-volatile memory cell includes:
sensing a first set of data values of the plurality of data values using a first voltage level on the different word line and a plurality of voltage levels on the source line; and
sensing a second set of data values of the plurality of data values using a second voltage level on the different word line and the plurality of voltage levels on the source line.

20. The method of claim 14, wherein sensing the plurality of data values from the different non-volatile memory cell includes comparing a voltage level of a bit line coupled to the NAND string to at least one of a plurality of reference voltage levels.

* * * * *